United States Patent
Loh et al.

(10) Patent No.: US 9,236,864 B1
(45) Date of Patent: Jan. 12, 2016

(54) STACKED INTEGRATED CIRCUIT WITH REDUNDANCY IN DIE-TO-DIE INTERCONNECTS

(75) Inventors: Siang Poh Loh, Sungai Petani (MY); Chooi Pei Lim, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/352,212

(22) Filed: Jan. 17, 2012

(51) Int. Cl.
*H01L 23/02* (2006.01)
*H03K 19/003* (2006.01)
*H01L 23/538* (2006.01)

(52) U.S. Cl.
CPC ............ *H03K 19/003* (2013.01); *H01L 23/538* (2013.01); *H03K 19/00315* (2013.01)

(58) Field of Classification Search
CPC ............... H01L 23/538; H03K 19/003; H03K 19/00315
USPC ......... 438/106; 257/686, 106; 326/10, 11, 16, 326/12
See application file for complete search history.

(56) References Cited

U.S. PATENT DOCUMENTS

| | | | |
|---|---|---|---|
| 4,899,067 A | 2/1990 | So et al. | |
| 5,260,611 A | 11/1993 | Cliff et al. | |
| 5,369,314 A | 11/1994 | Patel et al. | |
| 5,434,514 A | 7/1995 | Cliff et al. | |
| 5,592,102 A | 1/1997 | Lane et al. | |
| 5,926,036 A | 7/1999 | Cliff et al. | |
| 6,034,536 A | 3/2000 | McClintock et al. | |
| 6,107,820 A | 8/2000 | Jefferson et al. | |
| 6,167,558 A | 12/2000 | Trimberger | |
| 6,201,404 B1 | 3/2001 | Reddy et al. | |
| 6,344,755 B1 | 2/2002 | Reddy et al. | |
| 6,600,337 B2 | 7/2003 | Nguyen et al. | |
| 6,605,962 B2 | 8/2003 | Lee et al. | |
| 6,630,842 B1 | 10/2003 | Lewis et al. | |
| 6,653,862 B2 | 11/2003 | Johnson et al. | |
| 6,965,249 B2 | 11/2005 | Lane et al. | |
| 7,180,324 B2 | 2/2007 | Chan et al. | |
| 7,190,061 B2* | 3/2007 | Lee | 257/686 |

(Continued)

FOREIGN PATENT DOCUMENTS

| | | |
|---|---|---|
| CN | 1714508 A | 12/2005 |
| CN | 1956101 A | 5/2007 |

(Continued)

OTHER PUBLICATIONS

U.S. Appl. No. 13/014,990, filed Jan. 27, 2011, Lewis.

(Continued)

*Primary Examiner* — Robert Huber

(74) *Attorney, Agent, or Firm* — Mauriel Kapouytian Woods LLP; Ararat Kapouytian

(57) ABSTRACT

An integrated circuit (IC) is provided where the IC includes a first die, a second die stacked above the first die, and a plurality of die-to-die interconnects coupling the first die to the second die, where the plurality of die-to-die interconnects includes at least one redundancy die-to-die interconnect. In one implementation, the plurality of die-to-die interconnects includes a plurality of pre-designated die-to-die interconnects, where if a pre-designated die-to-die interconnect of the plurality of pre-designated die-to-die interconnects is defective, then signals intended for transmission via the pre-designated die-to-die interconnect are instead transmitted via the at least one redundancy die-to-die interconnect.

5 Claims, 4 Drawing Sheets

(56) References Cited

U.S. PATENT DOCUMENTS

| | | | |
|---|---|---|---|
| 7,215,140 B1 | 5/2007 | Saini et al. | |
| 7,414,429 B1 | 8/2008 | Kim et al. | |
| 7,508,321 B2 | 3/2009 | Gueziec et al. | |
| 7,644,386 B1 | 1/2010 | Chan et al. | |
| 7,800,238 B2 * | 9/2010 | Pratt | 257/777 |
| 8,138,015 B2 * | 3/2012 | Joseph et al. | 438/106 |
| 2003/0026135 A1 * | 2/2003 | Hill et al. | 365/189.02 |
| 2006/0001176 A1 * | 1/2006 | Fukaishi et al. | 257/777 |
| 2010/0060310 A1 * | 3/2010 | Laisne et al. | 326/10 |

FOREIGN PATENT DOCUMENTS

| | | |
|---|---|---|
| JP | 02-073721 A | 3/1990 |
| JP | 2001-023390 A | 1/2001 |
| JP | 2002-140895 A | 5/2002 |
| JP | 2004-192792 A | 7/2004 |
| JP | 2006-107590 A | 4/2006 |
| JP | 2007-096918 A | 4/2007 |
| KR | 10-0289806 B1 | 5/2001 |

OTHER PUBLICATIONS

Betz, V. et al., Architecture and CAD for Deep-Submicron FPGAs, Mar. 1999, pp. 11-19 (Chapter 2), 63-103 (Chapter 4), 105-126 (Chapter 5), and 151-190 (Chapter 7), Kluwer Academic Publishers.

Chang, S. et al., "Layout Driven Logic Synthesis for FPGAs," 1994, DAC '94 Proceedings of the 31st annual Design Automation Conference, 6 pages.

Hatori, F. et al., "Introducing Redundancy in Field Programmable Gate Arrays," IEEE Custom Integrated Circuits Conference, 1993, 7.1.1-7.1.4.

Katz, R. et al., "SEU Hardening of Field Programmable Gate Arrays (FPGAS) for Space Applications and Device Characterization," IEEE Transactions on Nuclear Science, Dec. 1994, vol. 41., No. 6., pp. 2179-2186.

Kelly, J. L. et al., "Defect Tolerent SRAM based FPGAs," IEEE, 1994, pp. 479-482.

International Search Report and Written Opinion issued in PCT/US2011/026708 dated Nov. 17, 2011.

U.S. Appl. No. 12/717,022, filed Mar. 3, 2010, Lewis, David.

Notification of Registration and Allowance in Chinese Patent Application No. 201180012098.7 dated Feb. 26, 2014.

Office Action in Japanese Patent Application No. 2012-556178 dated Feb. 12, 2012.

First Office Action in Chinese Patent Application No. 201180012098.7 dated May 30, 2013.

Second Office Action in Chinese Patent Application No. 201180012098.7 dated Nov. 13, 2013.

* cited by examiner

US 9,236,864 B1

STACKED INTEGRATED CIRCUIT WITH REDUNDANCY IN DIE-TO-DIE INTERCONNECTS

BACKGROUND

As process technology reaches the optical shrink limitation, it becomes more difficult to increase gate density at the rate predicted by Moore's Law using a monolithic, integrated circuit (IC) architecture. Three dimensional (3D) die stacking has becomes an alternative to the monolithic IC architecture for increasing gate density.

An established 3D die stacking technique in IC assembly involves use of die-to-die interconnects, such as micro bump interconnects (which are also referred to as µ-bumps) and through silicon via (TSV) interconnects. However, having a large number of die-to-die interconnects places a challenge on assembly yield. As the die-to-die interconnect count increases, the assembly yield for the 3D stacked die IC decreases. Generally, die-to-die interconnect counts for 3D stacked die ICs range from a 1000 to tens of 1000 s. Based on some industry estimates, a 3D stacked die IC with a die-to-die interconnect count of greater than 250 has a yield of approximately 60%.

Furthermore, die-to-die interconnect failures can only be detected after die assembly and at a final electrical test. Once one of the die-to-die interconnects fails, all the dies in the 3D stacked die IC will be identified as defective devices and will need to be rejected.

SUMMARY

Embodiments of the present invention involve the use of redundancy die-to-die interconnect schemes to increase yield in 3D stacked die ICs and to potentially reduce overall manufacturing costs for such ICs.

In one embodiment, an IC includes a first die, a second die stacked above the first die, and a plurality of die-to-die interconnects coupling the first die to the second die, where the plurality of die-to-die interconnects includes at least one redundancy die-to-die interconnect. In one embodiment, the plurality of die-to-die interconnects includes a plurality of pre-designated die-to-die interconnects, where if a pre-designated die-to-die interconnect of the plurality of pre-designated die-to-die interconnects is defective, then signals intended for transmission via the pre-designated die-to-die interconnect are instead transmitted via the at least one redundancy die-to-die interconnect.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
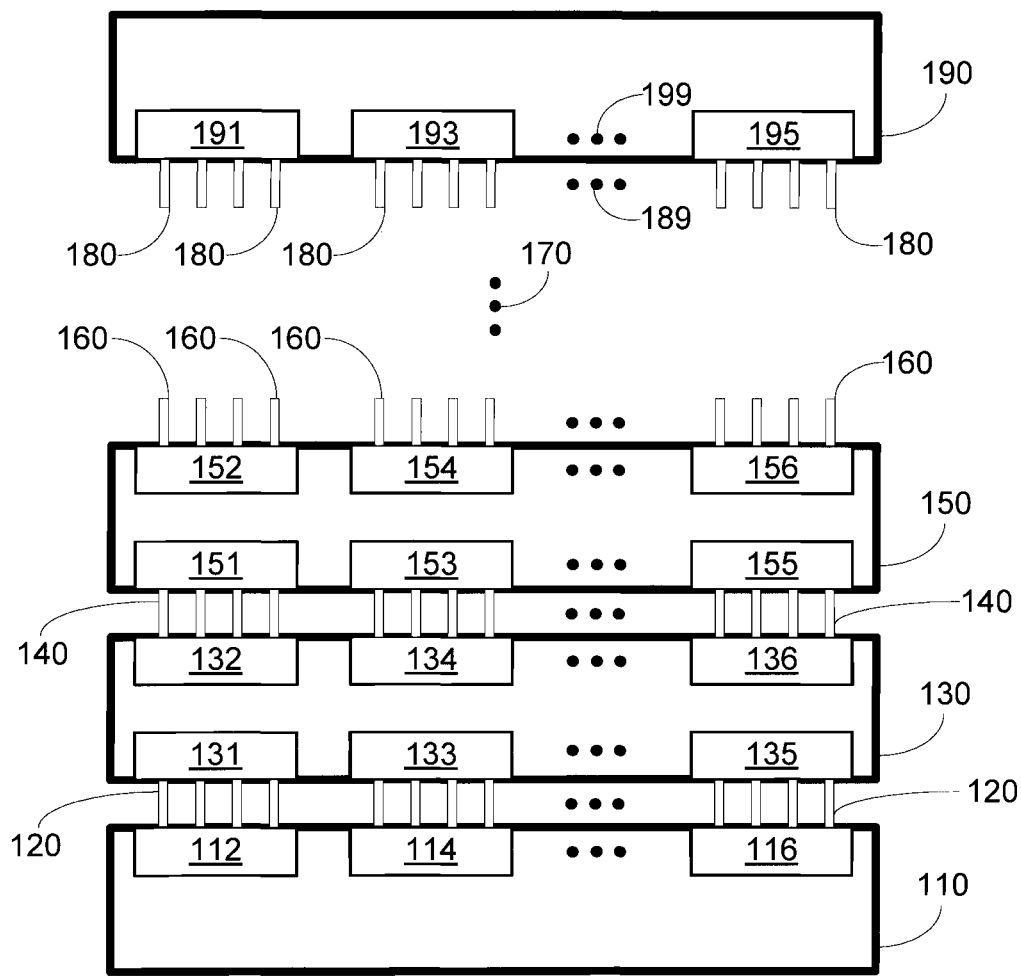
FIG. 1 is a block diagram of one embodiment of an IC of the present invention.

FIG. 1 is a block diagram of one embodiment of an IC of the present invention. More specifically, FIG. 1 is a vertical cross-sectional view of one embodiment of an IC of the present invention. IC 100 is a stacked IC. In other words, it includes a plurality of dies that are stacked. IC 100 includes dies 110, 130, 150, and 190 that are stacked on top of one another. In FIG. 1, only four dies are shown. However, as indicated by the ellipses 170 in FIG. 1, IC 100 may include a number of additional dies between dies 150 and 190. More generally, IC 100 includes N dies, where N is an integer equal to or greater than 2.

In IC 100, die 110, the bottommost die, is coupled to die 130 by die-to-die interconnects 120. Similarly, die 130 is coupled to die 150 by die-to-die interconnects 140. In turn, die 150 is coupled to the die immediately above it by die-to-die interconnects 160. Die 190, the topmost die, is coupled to the die immediately below it by die-to-die interconnects 180. If there is no die or dies between dies 150 and 190, then IC 100 would include either die-to-die interconnects 160 or die-to-die interconnects 180 and die 150 would be coupled to die 190 by either die-to-die interconnects 160 or die-to-die interconnects 180. In one embodiment, die-to-die interconnects 120, 140, 160, and 180 are micro bump interconnects. In another embodiment, die-to-die interconnects 120, 140, 160, and 180 are TSV interconnects.

Die 110 includes redundancy control circuits 112, 114, and 116, which are bottom-die redundancy control circuits. Die 130 includes redundancy control circuits 131, 133, and 135, which are top-die redundancy control circuits, and redundancy control circuits 132, 134, and 136, which are bottom-die redundancy control circuits. Die 150 includes redundancy control circuits 151, 153, and 155, which are top-die redundancy control circuits, and redundancy control circuits 152, 154, and 156, which are bottom-die redundancy control circuits. Die 190 includes redundancy control circuits 191, 193, and 195, which are top-die redundancy control circuits.

In FIG. 1, three bottom-die redundancy control circuits and/or three top-die redundancy control circuits are shown in each die. However, each die may include more bottom-die redundancy control circuits and/or top-die redundancy control circuits. For example, as indicated by ellipses 199 in die 190, die 190 may include top-die redundancy control circuits in addition to top-die redundancy control circuits 191, 193, and 195. Generally, each die includes M bottom-die redundancy control circuits and/or M top-die redundancy control circuits, where M is an integer equal to or greater than 1. Also, in FIG. 1, not all the die-to-die interconnects of IC 100 are shown. For example, as indicated by ellipses 189, IC 100 may include more die-to-die interconnects 180 than those shown in FIG. 1.

In IC 100, there are four die-to-die interconnects coupling each pair of redundancy control circuits. For example, there are four die-to-die interconnects 120 coupling bottom-die redundancy control circuit 112 to its corresponding top-die redundancy control circuit 131. As used herein, in a pair of corresponding redundancy control circuits, a bottom-die redundancy control circuit refers to the control circuit in the bottom die and a top-die redundancy control circuit refers to the control circuit in the top die. Also, as used herein, bottom die and top die refer to the relative position of the dies that include the bottom-die redundancy control circuit and top-die redundancy control circuit, respectively, in a pair of corresponding redundancy control circuits.

As noted above, in IC 100, there are four die-to-die interconnects coupling a bottom-die redundancy control circuit to its corresponding top-die redundancy control circuit. In one embodiment, three of these four die-to-die interconnects are pre-designated die-to-die interconnects, whereas the remaining one of these four die-to-die interconnects is a redundancy die-to-die interconnect. In another embodiment, there may be more or less than four die-to-die interconnects coupling a pair of corresponding redundancy control circuit and one or more of those die-to-die interconnects may be redundancy die-to-die interconnects.

In one embodiment, the redundancy ratio, i.e., the ratio of redundancy die-to-die interconnects to pre-designated die-to-die interconnects, used depends on the die-to-die interconnect yield and the targeted recovery rate. As the die-to-die interconnect yield improves, one can use a lower redundancy ratio. It is to be noted that, in one embodiment, the added redundancy capability is achieved without adding additional die-to-die interconnects as the IC may already have unutilized die-to-die interconnects.

Figure 2:
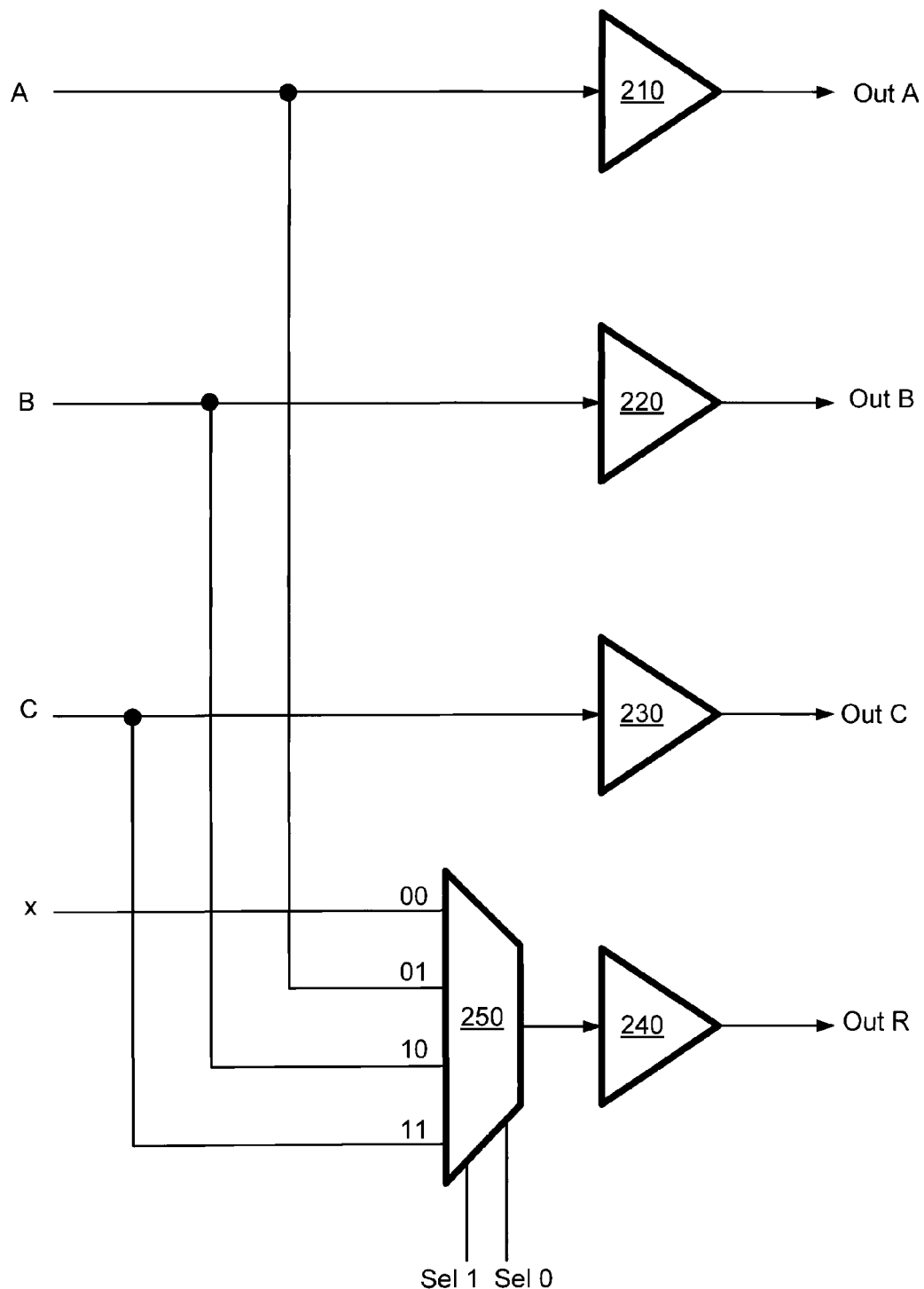
FIG. 2 is a detailed diagram of an embodiment of a bottom-die redundancy control circuit of FIG. 1.

FIG. 2 is a detailed diagram of an embodiment of a bottom-die redundancy control circuit of FIG. 1. In FIG. 2, bottom-die redundancy control circuit 200 includes buffers 210-240 and multiplexer 250 which are coupled as shown. A multiplexer may also herein be referred to as a selector. Bottom-die redundancy control circuit 200 may be any of the bottom-die redundancy control circuits shown in FIG. 1.

Bottom-die redundancy control circuit 200 receives inputs A, B, C, and x. In one embodiment, inputs A, B, and C represent user signals received from the LAB routing interface of the bottom die. Input x is a do not care input signal. In one embodiment, input x is a grounded signal. If the die-to-die interconnects dedicated to (or pre-designated for) transmitting signals A, B, and C, respectively, are not defective, then signals A, B, and C are output via buffers 210, 220, and 230, respectively, as signals Out A, Out B, and Out C, respectively. It is to be noted that the default condition is that signals A, B, and C are output via buffers 210, 220, and 230, respectively, as signals Out A, Out B, and Out C, respectively. In other words, the default condition is not to use the redundancy path. On the other hand, if one of the die-to-die interconnects dedicated to transmitting signals A, B, and C is defective, then the signal that would normally be transmitted via that defective die-to-die interconnect would be instead transmitted via the redundancy die-to-die interconnect. More specifically that signal would be transmitted via multiplexer 250 and buffer 240 as out R.

The path from input A to buffer 210 and Out A may be referred to as a pre-designated signal path, which in this case is pre-designated for transmitting signals A. Similarly, the path from input B to buffer 220 and Out B may also be referred to as a pre-designated signal path, which in this case is pre-designated for transmitting signals B. Also similarly, the path from input C to buffer 230 and Out C may also be referred to as a pre-designated signal path, which in this case is pre-designated for transmitting signals C. The path including input x, multiplexer 250, the input paths to multiplexer 250, and buffer 240 may herein be referred to as a redundancy path.

As shown in FIG. 2, multiplexer 250 receives signals A, B, C, and x. If the select signals sel 1 and sel 0 are 0 and 0, respectively, (which indicates that the die-to-die interconnects dedicated to transmitting signals A, B, and C, respectively, are not defective) then multiplexer 250 selects input signal x and the redundancy path is not used. If the select signals sel 1 and sel 0 are 0 and 1, respectively, (which indicates that the die-to-die interconnect dedicated to transmitting signal A is defective) then multiplexer 250 selects input signal A which is output as Out R via the redundancy path. If the select signals sel 1 and sel 0 are 1 and 0, respectively, (which indicates that the die-to-die interconnect dedicated to transmitting signal B is defective) then multiplexer 250 selects input signal B which is output as Out R via the redundancy path. If the select signals sel 1 and sel 0 are 1 and 1, respectively, (which indicates that the die-to-die interconnect dedicated to transmitting signal C is defective) then multiplexer 250 selects input signal C which is output as Out R via the redundancy path. Table 1 below shows the correspondence between the signals sel1, sel 0, and the signal transmitted via the redundancy path.

TABLE 1

| Sel 1 | Sel 0 | Redundancy Path Signal |
| --- | --- | --- |
| 0 | 0 | Unused (default condition) |
| 0 | 1 | Out A |
| 1 | 0 | Out B |
| 1 | 1 | Out C |

Outputs Out A, Out B, and Out C are coupled to their corresponding inputs of the corresponding top-die redundancy control circuit via pre-designated die-to-die interconnects (which are pre-designated for transmitting signals A, B, and C, respectively). On the other hand, output Out R is coupled to its corresponding input of the corresponding top-die redundancy control circuit via a redundancy die-to-die interconnect. In one embodiment, in being transmitted from the bottom-die redundancy control circuit to the corresponding top-die redundancy control circuit, outputs Out A, Out B, Out C, and Out R pass through a re-distribution layer (metal layer) in the bottom die, the corresponding die-to-die interconnects, and a re-distribution layer (metal layer) in the top die.

Figure 3:
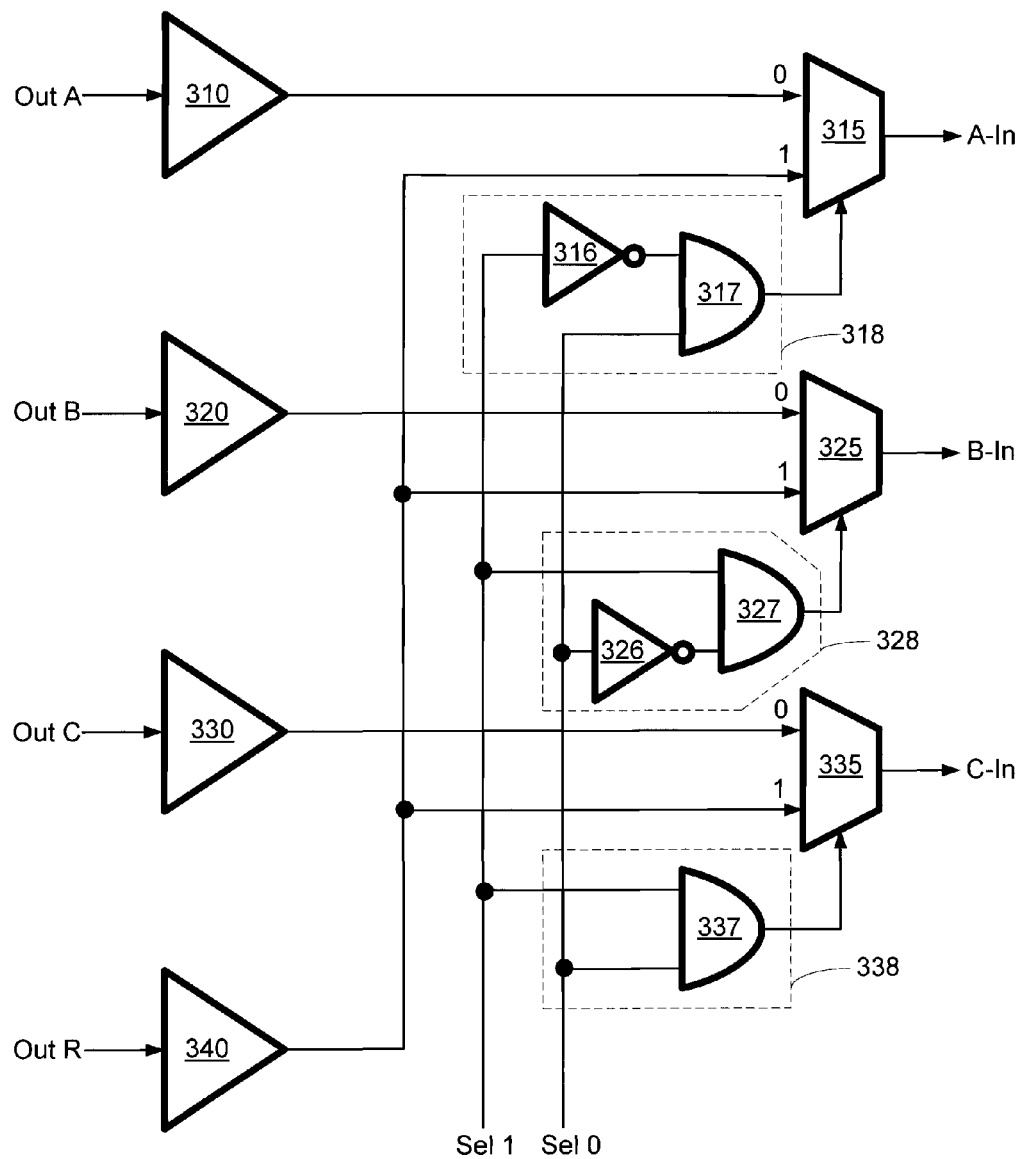
FIG. 3 is a detailed diagram of an embodiment of a top-die redundancy control circuit of FIG. 1.

FIG. 3 is a detailed diagram of an embodiment of a top-die redundancy control circuit of FIG. 1. In FIG. 3, top-die redundancy control circuit 300 includes buffers 310, 320, 330, 340, multiplexers 315, 325, 335, and decoding logic circuits 318, 328, 338, which are coupled as shown. Decoding logic circuit 318 includes inverter 316 and AND gate 317, which are coupled as shown. Decoding logic circuit 328 includes inverter 326 and AND gate 327, which are coupled as shown. Decoding logic circuit 338 includes AND gate 337. Top-die redundancy control circuit 300 may be any of the top-die control circuits shown in FIG. 1.

Top-die redundancy control circuit 300 receives signals Out A, Out B, Out C, and Out R, via die-to-die interconnects A, B, C, and R, respectively. Die-to-die interconnects A, B, and C, which are pre-designated for transmitting signals A, B, and C, respectively, are pre-designated die-to-die interconnects. On the other hand, die-to-die interconnect R, which is for transmitting a redundancy signal, is a redundancy die-to-die interconnect. When one of the pre-designated die-to-die interconnects A, B, and C is defective, then redundancy die-to-die interconnect R transmits signal that were intended for transmission on the defective pre-designated die-to-die interconnect.

Signals Out A, Out B, Out C, and Out R are received by buffers 310, 320, 330, and 340, respectively. The output terminal of buffers 310, 320, and 330 are coupled to the 0 input terminals of multiplexers 315, 325, and 335, respectively. The output terminal of buffer 340 is coupled to the 1 input terminal of each of multiplexers 315, 325, and 335. In other words, multiplexers 315, 325, and 335 receive, at input terminal 0, signals Out A, Out B, Out C, respectively. Furthermore, all of multiplexers 315, 325, and 335 receive, at input terminal 1, signal Out R.

Each of decoding logic circuits 318, 328, 338 receives select signals sel 1 and sel 0. Decoding logic circuits 318, 328, 338 provide select signals to multiplexers 315, 325, and 335, respectively.

In decoding logic circuit 318, inverter 316 receives select signal sel 1, whereas one input terminal of AND gate 317 receives select signal sel 0. The output of inverter 316 is provided to the other input terminal of AND gate 317. The output of decoding logic circuit 318, which is the same as the output of AND gate 317, is provided to multiplexer 315 as a select signal. The select signal provided by decoding logic circuit 318 determines the selection by multiplexer 315.

In decoding logic circuit 328, inverter 326 receives select signal sel 0, whereas one input terminal of AND gate 327 receives select signal sel 1. The output of inverter 326 is provided to the other input terminal of AND gate 327. The output of decoding logic circuit 328, which is the same as the output of AND gate 327, is provided to multiplexer 325 as a select signal. The select signal provided by decoding logic circuit 328 determines the selection by multiplexer 325.

In decoding logic circuit 338, one input terminal of AND gate 337 receives select signal sel 1, whereas the other input terminal of AND gate 337 receives select signal sel 0. The output of decoding logic circuit 338, which is the same as the output of AND gate 337, is provided to multiplexer 335 as a select signal. The select signal provided by decoding logic circuit 338 determines the selection by multiplexer 335.

In one embodiment, redundancy control circuits are controlled by configuration random access memory (RAM) bits. In one embodiment, the configuration RAM bits are re-programmable through the IC design software, e.g., Quartus II® design software application available from Altera® Corporation of San Jose, Calif. As indicated above, the default configuration RAM settings bypass the redundancy die-to-die interconnects. Once a pre-designated die-to-die interconnect is detected as a failed path, the user can reconfigure the configuration RAM to switch over from the failed path to the redundancy die-to-die interconnect path.

Figure 4:
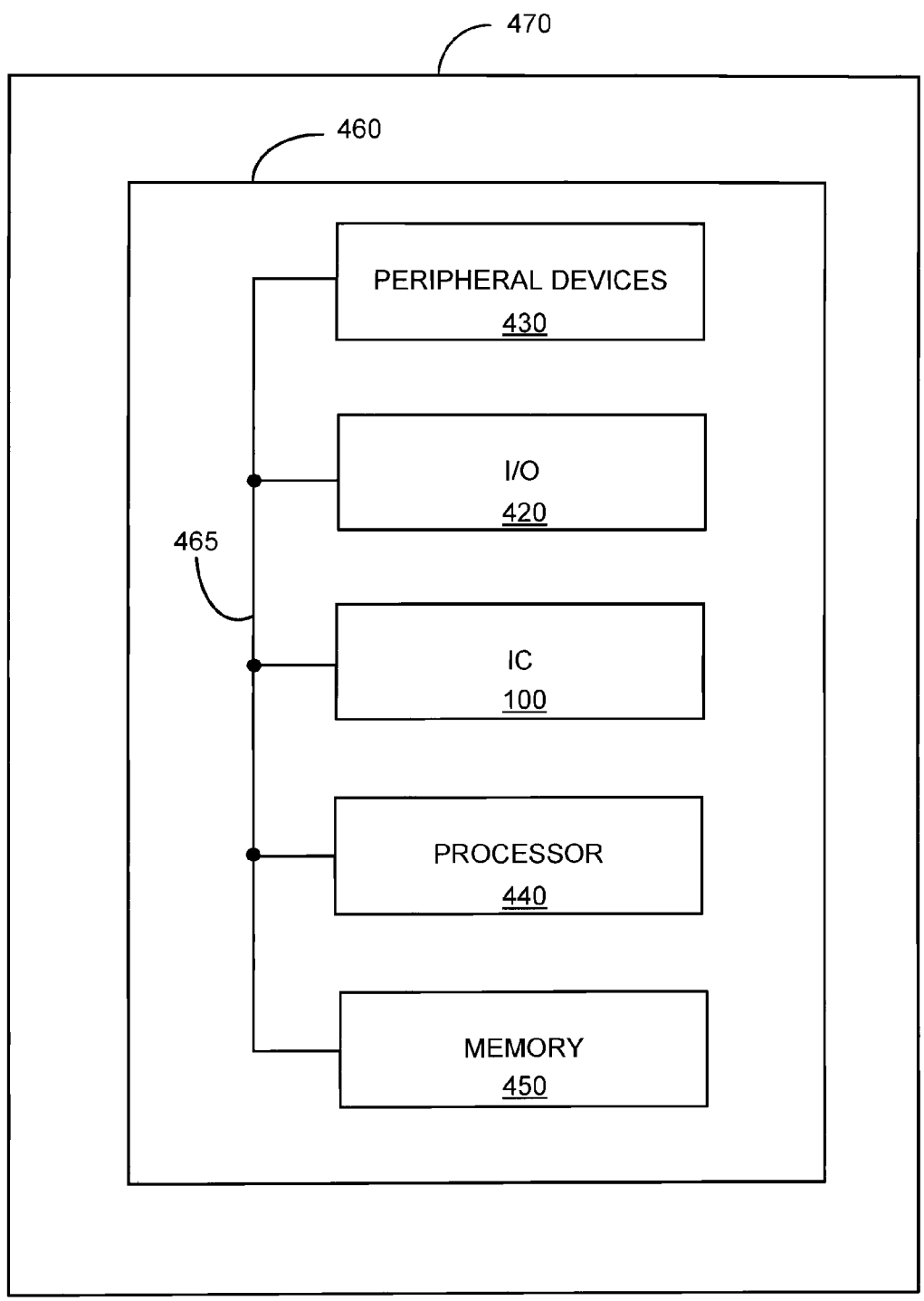
FIG. 4 illustrates an exemplary data processing system including an embodiment of an IC of the present invention.

FIG. 4 illustrates an exemplary data processing system including an embodiment of an IC of the present invention. In FIG. 4, data processing system 400 includes IC 100, input/output (I/O) circuitry 420, peripheral devices 430, processor 440, and memory 450. In one embodiment, these components are coupled together by system bus 465 and are populated on circuit board 460 which is contained in end-user system 470. A data processing system such as system 400 may include a single end-user system such as end-user system 470 or may include a plurality of systems working together as a data processing system.

In one embodiment, an IC of an embodiment of the present invention is a programmable logic device (PLD). Accordingly, in one embodiment, IC 100 is a PLD. PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs.

PLDs have configuration elements that may be programmed or reprogrammed. Configuration elements may be realized as RAM bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a configuration RAM). However, many types of configurable elements may be used, including static or dynamic RAM (SRAM or DRAM), electrically erasable read-only memory (EEROM), flash, fuse, and anti-fuse programmable connections. The programming of configuration elements can also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

System 400 can be used in a wide variety of applications, such as computer networking, data networking, instrumentation, video processing, digital signal processing (DSP), or any other application where the advantage of using programmable or reprogrammable logic is desirable. IC 100 can be used to perform a variety of different logic functions. For example, IC 100 can be configured as a processor or controller that works in cooperation with processor 440 (or, in alternative embodiments, IC 100 might itself act as the sole system processor). IC 100 may also be used as an arbiter for arbitrating access to a shared resource in system 400. In yet another example, IC 100 can be configured as an interface between processor 440 and one of the other components in system 400. It should be noted that system 400 is only exemplary.

In one embodiment, system 400 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An integrated circuit (IC) comprising:
   a first die including a bottom-die redundancy control circuit;
   a second die coupled to the first die, the second die including a top-die redundancy control circuit; and
   a plurality of die-to-die interconnects coupling the bottom-die redundancy control circuit to the top-die redundancy control circuit, wherein the plurality of die-to-die interconnects comprises a plurality of pre-designated die-to-die interconnects and at least one redundancy die-to-die interconnect, wherein the bottom-die redundancy control circuit comprises:
a plurality of pre-designated signal paths; and
a redundancy signal path, wherein the redundancy signal path includes a selector coupled to the plurality of pre-designated signal paths,
wherein the selector receives signals received by the plurality of pre-designated signal paths and an additional signal, wherein the additional signal is not a select signal for the selector, further wherein the selector selects a signal from its received signals and outputs the signal to a redundancy die-to-die interconnect of the at least one redundancy die-to-die interconnect,
further wherein the top-die redundancy control circuit comprises:
a plurality of selectors; and
a plurality of decoding logic circuits coupled to the plurality of selectors, wherein each decoding logic circuit of the plurality of decoding logic circuits is coupled to a corresponding selector of the plurality of selectors,
wherein each selector of the plurality of selectors receives a signal from a corresponding pre-designated die-to-die interconnect and a signal from a redundancy die-to-die interconnect of the at least one redundancy die-to-die interconnect, further wherein each selector of the plurality of selectors receives a select signal from a corresponding decoding logic circuit of the plurality of decoding logic circuits.

2. The IC of claim 1, wherein if a pre-designated die-to-die interconnect of the plurality of pre-designated die-to-die interconnects is defective, then signals intended for transmission via the pre-designated die-to-die interconnect are instead transmitted via the at least one redundancy die-to-die interconnect.

3. The IC of claim 1, wherein the plurality of die-to-die interconnects comprises four die-to-die interconnects, wherein three of the four die-to-die interconnects are pre-designated die-to-die interconnects and one of the four die-to-die interconnects is a redundancy die-to-die interconnect.

4. The IC of claim 1, wherein the plurality of die-to-die interconnects comprises a plurality of micro bump interconnects.

5. The IC of claim 1, wherein the IC is a programmable logic device.

* * * * *